US010855256B2

(12) United States Patent
Suko

(10) Patent No.: US 10,855,256 B2
(45) Date of Patent: *Dec. 1, 2020

(54) NEAR FIELD RFID PROBE WITH TUNNING

(71) Applicant: NORTHROP GRUMMAN SYSTEMS CORPORATION, Falls Church, VA (US)

(72) Inventor: Scott Kent Suko, Dayton, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/750,526

(22) Filed: Jan. 23, 2020

(65) Prior Publication Data

US 2020/0204163 A1    Jun. 25, 2020

Related U.S. Application Data

(63) Continuation of application No. 16/230,266, filed on Dec. 21, 2018, now Pat. No. 10,637,444.

(51) Int. Cl.
*H03J 7/04* (2006.01)
*G06K 7/10* (2006.01)
(Continued)

(52) U.S. Cl.
CPC ............ *H03J 7/04* (2013.01); *G06K 7/10297* (2013.01); *H02J 50/12* (2016.02); *H02J 50/20* (2016.02); *H03H 19/004* (2013.01)

(58) Field of Classification Search
CPC ... H03J 7/04; G06K 7/10297; G06K 7/10009; G06K 7/10316; H02J 50/12; H02J 50/20; H03H 19/004
See application file for complete search history.

(56) References Cited

U.S. PATENT DOCUMENTS 5,396,251 A * 3/1995 Schuermann ......... G01S 7/4008
342/42
5,680,106 A * 10/1997 Schrott .............. G06K 19/0672
340/10.33
(Continued)

OTHER PUBLICATIONS

Kesler: "Highly Resonant Wireless Power Transfer: Safe, Efficient, and over Distance"; found on the internet Dec. 21, 2018 at http://witricity.com/wp-content/uploads/2016/12/White_Paper_20161218.pdf.
(Continued)

*Primary Examiner* — Daniel I Walsh
(74) *Attorney, Agent, or Firm* — Tarolli, Sundheim, Covell & Tummino LLP

(57) ABSTRACT

A near field radio-frequency identification ("RFID") probe includes a probe tip comprising a resonant coil configured to communicate with an RFID compatible device at a predetermined resonant frequency. The near field RFID probe further includes a plurality of switch capacitor networks each comprising a capacitor and an RF switch, wherein switching the plurality of switch capacitor networks changes the capacitance of the resonant coil, thereby changing the resonant frequency of the resonant coil. The near field RFID probe further includes a probe control module configured to adjust the resonant frequency of the resonant coil to maintain the predetermined resonant frequency by switching the switch capacitor networks responsive to detecting that the resonant frequency of the resonant coil has deviated from the predetermined resonant frequency.

19 Claims, 5 Drawing Sheets

(51) Int. Cl.
*H02J 50/12* (2016.01)
*H02J 50/20* (2016.01)
*H03H 19/00* (2006.01)

(56) References Cited

U.S. PATENT DOCUMENTS

| | | | |
|---|---|---|---|
| 5,986,455 A | 11/1999 | Magnuson | |
| 5,990,681 A | 11/1999 | Richard et al. | |
| 6,840,440 B2 | 1/2005 | Uozumi et al. | |
| 6,940,358 B1* | 9/2005 | Meacham | H04B 1/1036 327/156 |
| 7,113,139 B2* | 9/2006 | Charrat | H01Q 1/2216 343/745 |
| 7,339,481 B2 | 3/2008 | Duron | |
| 7,385,459 B2* | 6/2008 | Duan | H01P 1/203 333/246 |
| 7,539,465 B2 | 5/2009 | Quan | |
| 8,473,017 B2* | 6/2013 | Milosavljevic | H01Q 1/241 343/702 |
| 8,476,986 B2* | 7/2013 | van Bezooijen | H04B 1/0458 333/17.3 |
| 8,629,813 B2* | 1/2014 | Milosavljevic | H01Q 1/243 343/850 |
| 9,741,245 B1 | 8/2017 | Fischer | |
| 10,186,769 B1* | 1/2019 | Judkins | H04L 25/085 |
| 10,263,336 B1* | 4/2019 | Wong | H01Q 1/521 |
| 10,418,717 B2* | 9/2019 | Johnsson | H04B 1/0458 |
| 10,637,444 B1* | 4/2020 | Suko | H02J 50/20 |
| 2002/0180648 A1* | 12/2002 | Boyle | H01Q 9/045 343/702 |
| 2003/0057279 A1 | 3/2003 | Uozumi et al. | |
| 2004/0065733 A1 | 4/2004 | Fukuoka | |
| 2004/0238950 A1* | 12/2004 | Doan | H01L 23/5222 257/734 |
| 2005/0104790 A1* | 5/2005 | Duron | H01L 29/66636 343/745 |
| 2005/0134435 A1* | 6/2005 | Koyama | G06K 19/0723 340/10.34 |
| 2005/0237163 A1* | 10/2005 | Lee | G06K 19/0723 340/10.51 |
| 2006/0220863 A1* | 10/2006 | Koyama | G08B 13/2402 340/572.1 |
| 2007/0001768 A1 | 1/2007 | Kim et al. | |
| 2007/0013483 A1* | 1/2007 | Stewart | G06K 7/0008 340/10.3 |
| 2007/0268113 A1 | 11/2007 | Johnson | |
| 2007/0296593 A1* | 12/2007 | Hall | G06K 19/0723 340/572.7 |
| 2008/0088415 A1* | 4/2008 | Quan | G06K 7/0008 340/10.3 |
| 2008/0194200 A1* | 8/2008 | Keen | G08B 13/2417 455/41.1 |
| 2008/0252366 A1* | 10/2008 | Chang | H03H 11/1291 327/557 |
| 2008/0316118 A1* | 12/2008 | Puente Baliarda | H01Q 13/10 343/702 |
| 2009/0058607 A1* | 3/2009 | Hou | H01Q 7/00 340/10.1 |
| 2009/0102663 A1* | 4/2009 | Hillegass | H01Q 7/00 340/572.5 |
| 2009/0134949 A1* | 5/2009 | He | H03H 7/40 333/17.3 |
| 2009/0146750 A1* | 6/2009 | Pernia | H03B 5/1287 331/116 R |
| 2009/0284220 A1* | 11/2009 | Toncich | H01F 38/14 320/108 |
| 2010/0099369 A1* | 4/2010 | Ozgun | H04B 1/0458 455/125 |
| 2010/0188086 A1* | 7/2010 | Lazar | G01R 33/3628 324/318 |
| 2011/0140772 A1* | 6/2011 | Sengupta | H03F 3/24 330/2 |
| 2011/0227666 A1* | 9/2011 | Manssen | H03H 7/004 333/32 |
| 2012/0049647 A1* | 3/2012 | Kim | H02J 50/40 307/104 |
| 2013/0009722 A1* | 1/2013 | White | H03H 7/40 333/17.3 |
| 2013/0112747 A1* | 5/2013 | McFarthing | H04B 5/0031 235/439 |
| 2013/0277351 A1* | 10/2013 | Lamesch | B60R 21/015 219/202 |
| 2013/0307742 A1* | 11/2013 | Hu | H01Q 1/243 343/821 |
| 2014/0015327 A1* | 1/2014 | Keeling | B60L 53/63 307/104 |
| 2014/0028110 A1* | 1/2014 | Petersen | H02J 50/12 307/104 |
| 2014/0327398 A1 | 11/2014 | Sato | |
| 2014/0361627 A1* | 12/2014 | Kurs | H02J 50/50 307/104 |
| 2015/0155737 A1* | 6/2015 | Mayo | H02J 5/005 320/108 |
| 2015/0341087 A1* | 11/2015 | Moore | H02J 50/50 455/77 |
| 2016/0013667 A1* | 1/2016 | Hosotani | H02J 50/40 307/104 |
| 2017/0346343 A1* | 11/2017 | Atasoy | H02J 50/12 |
| 2017/0353055 A1* | 12/2017 | Han | H02J 7/025 |
| 2018/0088193 A1 | 3/2018 | Rearick et al. | |
| 2018/0337547 A1* | 11/2018 | Menegoli | H02J 7/0044 |
| 2019/0068248 A1* | 2/2019 | Kanno | H02J 50/12 |
| 2019/0227012 A1 | 7/2019 | Zens | |
| 2019/0245517 A1 | 8/2019 | Nosaka | |

OTHER PUBLICATIONS

Kurs, et al.: "Wireless Power Transfer via Strongly Coupled Magnetic Resonances"; downloaded from www.sciencemag.org on Aug. 17, 20017.

Usami: "An Ultra-Small RFID Chip: μ-chip"; 2004 IEEE Asia-Pacific Conference on Advanced System Integrated Circuits (AP-ASIC2004)/ Aug. 4-5, 2004.

* cited by examiner

NEAR FIELD RFID PROBE WITH TUNNING

RELATED APPLICATIONS

This application claims priority from U.S. patent application Ser. No. 16/230,266, filed 21 Dec. 2018, which is incorporated herein in its entirety.

TECHNICAL FIELD

This disclosure relates to Radio Frequency Identification ("RFID") tracking and, more particularly, to a tunable near field RFID probe.

BACKGROUND

Radio Frequency Identification ("RFID") is commonly used for tracking and identifying items, such as electronics, as the items are transported and moved through a supply chain, for example, or when items are deployed for use in the field. A use of a portable near field reader allows for rapid identification and validation of the items. While the term "near field" is commonly used to refer to a standard operating at 13.56 MHz, the term "near field" as used herein may refer to any system where the distance between a transmitter and a receiver is small (i.e. under ½π wavelengths), and where antennas are replaced by pick up coils such that magnetic coupling dominates.

SUMMARY

Described herein is a near field link operating at microwave frequencies (i.e. in GHz) over short distances measured in millimeters or centimeters, In one example, a radio-frequency identification ("RFID") probe is provided that comprises a probe tip comprising a resonant coil configured to communicate with an RFID compatible device at a predetermined resonant frequency, and a plurality of switch capacitor networks each comprising a capacitor and an RF switch. The switching of the plurality of switch capacitor networks changes the capacitance of the resonant coil, thereby changing a resonant frequency of the resonant coil. The RFID probe further comprises a probe control module configured to adjust the resonant frequency of the resonant coil to maintain the predetermined resonant frequency by switching the switch capacitor networks responsive to detecting that the resonant frequency of the resonant coil has deviated from the predetermined resonant frequency.

In another example, a tunable resonant coil comprising a plurality of switch capacitor networks, each comprising a capacitor and an RF switch. The plurality of switch capacitor networks is configured to change the capacitance of the resonant coil, thereby change the resonant frequency of the resonant coil, responsive to receiving a control signal indicating that the resonant frequency of the resonant coil has deviated from a target resonant frequency.

In yet another example, a method includes establishing communication between a resonant coil of a radio-frequency identification ("RFID") probe with an RFID tag at a predetermined resonant frequency. The method further includes determining that the resonant frequency of the resonant coil has deviated from the predetermined resonant frequency. The method further includes adjusting the resonant frequency of the resonant coil by switching a switched capacitor network coupled to the resonant coil.

DETAILED DESCRIPTION

One example RFID application combines encryption, sensors, near-field power, and communications into an integrated circuit referred to as a "dielet" that can be inserted into an item or into packaging of the item. A dielet is a small tag (e.g. 100 u×100 u) with an on chip pickup coil. In one example, the pickup coil is excited at a high microwave frequency, such as of 5.8 GHz. RFID tracking is accomplished by using an external portable probe to communicate with RFID enabled devices including the dielet. A tip of the probe and the dielet each include a coil to establish communication via an inductive coupling at a predetermined resonant frequency. The coils on both the dielet and the probe tip are tuned to the predetermined resonant frequency in order to maximize power transfer. However, the resonant frequency of the probe tip may change as the environment changes, and therefore, deteriorating the power transfer. Specifically, changes in the inductance between the probe tip and the dielet, that result from changes in distance between the probe tip and the dielet, shifts the resonant frequency. Moreover, metal objects in the local area near the dielet and the probe tip may also cause a shift in the resonant frequency.

This disclosure relates to a near field radio-frequency identification (RFID) probe with resonant frequency tuning capabilities to overcome the problem of shifting resonant frequency. In particular, described herein is a resonant frequency tuning system which uses RF switches and capacitors in a tip of a probe to tune a resonant frequency of the probe tip to a desired resonant frequency that matches a resonant frequency of an RFID compatible device including an RFID tag, such as a dielet. Thus, power transfer deterioration between the probe tip and the RFID tag resulting from environment changes is reduced or eliminated.

Figure 1:
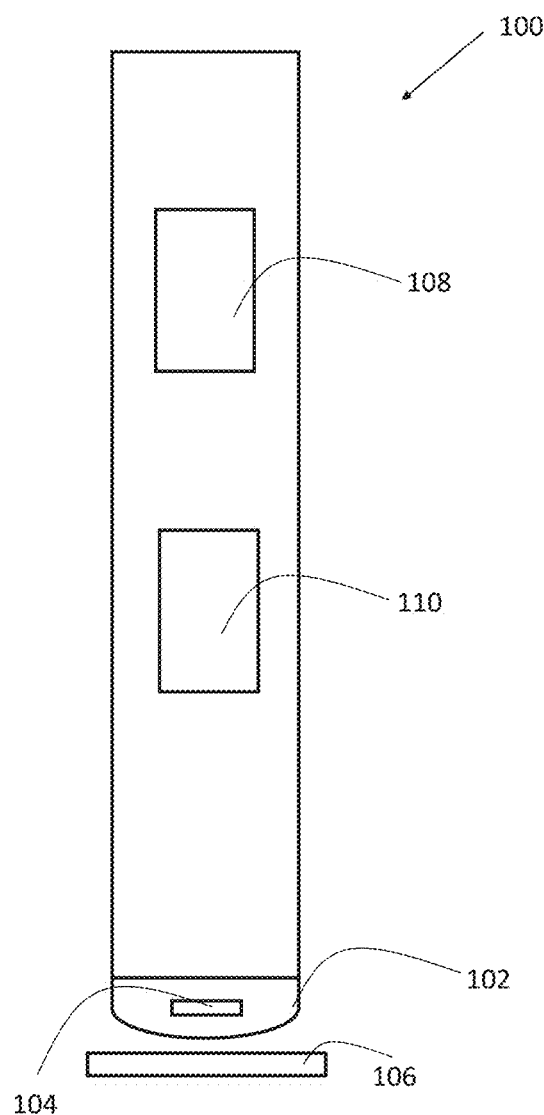
FIG. 1 illustrates a radio-frequency identification (RFID) probe with resonant frequency tuning capabilities.

FIG. 1 illustrates an example an RFID probe with resonant frequency tuning capabilities (hereinafter "probe") 100. The probe 100 includes a probe tip 102 at an end of the probe 100. The probe 100 may include any suitable form or shape. In one example, the probe 100 is a narrow an elongated shape, such as a shape of a stylus pen, for enabling handling and maneuvering of the probe tip 102. In one example, the probe tip 102 may be removable and interchangeable.

The probe tip 102 includes a resonant coil 104 for establishing a communication via an inductive coupling at a predetermined resonant frequency with an external RFID tag (such as a dielet) 106 of an RFID enabled device. In particular, the resonant coil 104 of the probe tip 102 establishes communication with the RFID tag 106 upon the probe 100 being maneuvered into a position such that the probe tip 102 is proximate to the RFID tag 106.

The probe 100 includes a probe reader 108 configured to facilitate communication with the RFID tag 106 via the inductive coupling formed between the RFID tag 106 and the resonant coil 104. In particular, the probe reader 108 is electrically coupled to the probe tip 102 and is configured to produce and send RF signals to the probe tip 102 for communication to the RFID tag 106 via the resonant coil 104. The probe reader 108 is also configured to receive and interpret RF signals from the RFID tag 106.

The probe reader 108 is further configured to control the resonant frequency of the resonant coil 104. Thus, the probe reader 108 is able to dynamically make adjustments to the resonant frequency of the resonant coil 104 in real time when the resonant frequency shifts, such as when the environment changes. In particular, the probe reader 108 is configured to detect or determine the resonant frequency of the resonant coil 104. In one example, the probe 100 includes a sensor 110 configured to determine the resonant frequency of the resonant coil 104. The probe reader is communicatively coupled to the sensor 110. Thus, the probe reader 108 is configured to determine the resonant frequency of the resonant coil 104, and in particular a deviation in the resonant frequency, by communicating with and receiving data from the sensor 110 and analyzing the data received from the sensor 110. In one example, the probe reader 108 continuously scans for and determines changes in resonant frequency. In another example, the probe reader 108 periodically scans for and determines changes in resonant frequency.

Although the example probe 100 is illustrated to include the probe reader 108, another example probe (not shown) may be configured to communicate with an external probe reader (not shown) via a cable such as a coaxial cable. For example, a probe reader may be a mobile computing device such a laptop computer, a tablet computer, or a smartphone. It should be further appreciated that the probe reader 108, also referred to herein as a control module, may include electrical circuitry, executable computer logic, or a module including a combination of electrical circuitry and executable computer logic.

It should also be appreciated that, although the sensor 110 and the probe reader 108 are depicted as two components, the sensor 110 and the probe reader 108 may also be combined into a single component or device. In one example, the probe 100 may include the sensor 110 and be configured to communicate with an external probe reader (not shown). In another example, both the probe reader 108 and the sensor 110 may be external to the probe 100.

The resonant coil 104 includes switches and capacitors (not shown) that enable tuning of the resonant coil 104. In particular, adding capacitance to the resonant coil 104 changes the resonant frequency of the resonant coil 104. Thus, by turning on or off a series of switches coupled to a series of capacitors, the resonant frequency of the resonant coil 104 can be tuned. The probe reader 108 is configured to make adjustments to the resonant frequency of the resonant coil 104, in response to determining that the resonant frequency of the resonant coil 104 has shifted or deviated away from the target, predetermined, or desired resonant frequency, by sending a DC voltage signal that controls the switches.

Figure 2:
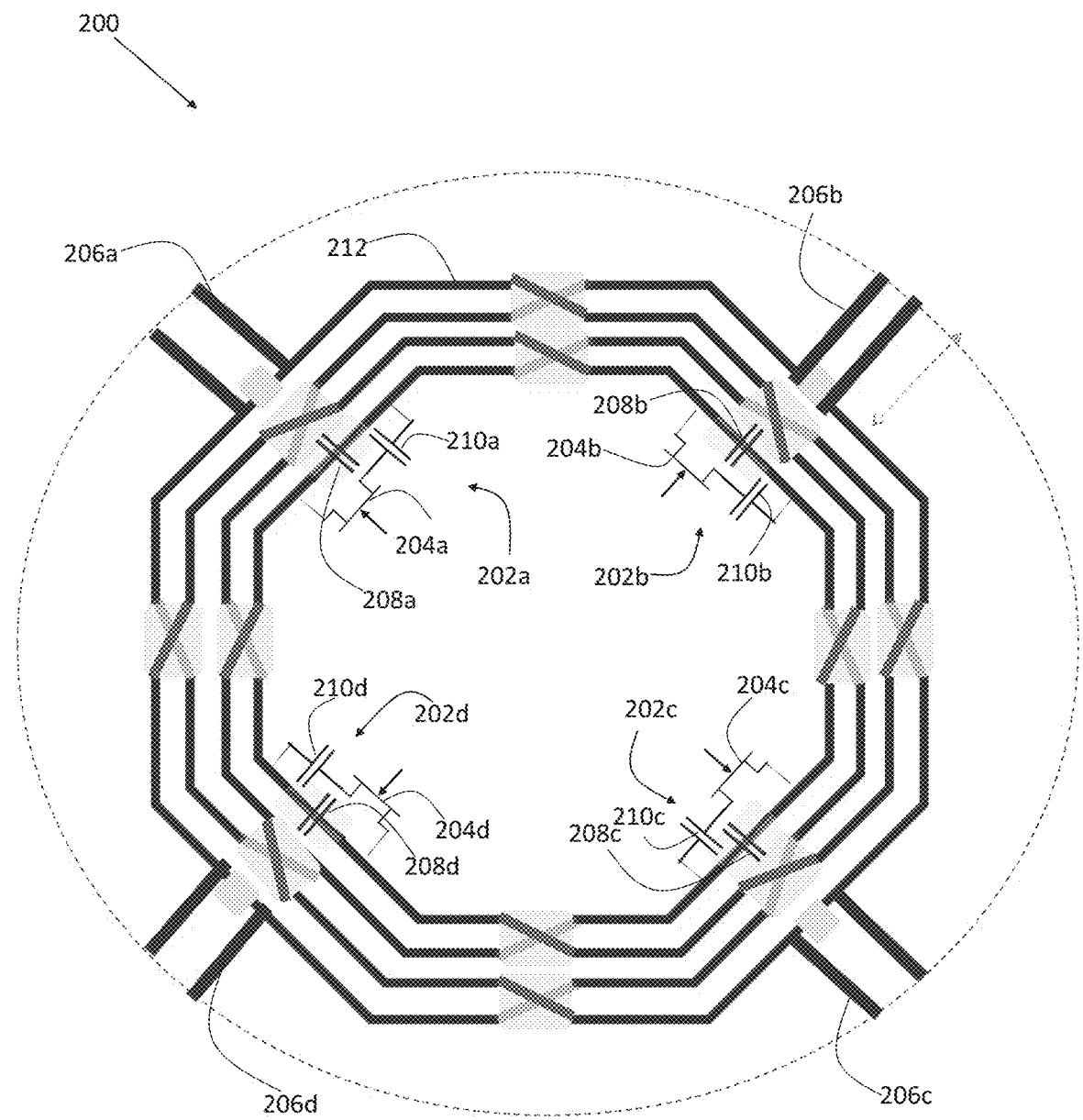
FIG. 2 illustrates an example resonant coil of the RFID probe of FIG. 1.

The probe reader's 108 control of the resonant frequency of the resonant coil 104 via the activation or deactivation of capacitors will be further understood and appreciated by looking at the resonant coil 104 in more detail. FIG. 2 illustrates an example resonant coil 200 (e.g. corresponding to the resonant coil 104 of FIG. 1). The resonant coil 200 is laid out in a crisscross spiral form with multiple strands 212, each of which follows a similar path, allowing for equal current sharing and therefore minimizing current loss. In the example resonant coil 200, the multiple strands 212 are connected in parallel with symmetric branching paths 206a, 206b, 206c, and 206d (hereinafter "branching path(s) 206") for receiving an RF signal from a probe reader (e.g. corresponding to the probe reader 108 of FIG. 1). This reduces total inductance and increases self-resonance of the resonant coil 200. In another example resonant coil (not shown), multiple strands may be connected in series.

In one example, the multiple strands 212 are each either fed with differential RF excitation or with single ended RF excitation, wherein the far ends of each strand are grounded. In one example, the multiple strands 212 are driven from a common RF signal brought to the probe tip 102 through a single connection with RF splitters, baluns, and/or matching networks on chip with the resonant coil 200. In one example, the multiple strands 212 are driven from a common RF signal and a plurality of step-down matching impedance networks to match the low impedance characteristic of a high Q series resonant network, in this example, the impedances of the various strands of the multiple strands 212 are aggregated in parallel, thus reducing the step-down ratio needed to achieve a given Q.

It should be appreciated that for a series resonant network, the proper matching impedance equals the square root of (inductance/capacitance)/Q, as such a high Q network requires a low impedance driving impedance to match it. It should be further appreciated that the achievable bandwidth of a given matching structure is reduced as the impedance matching ratio is increased. Thus, it is advantageous to use a plurality of interleaved strands and an associated plurality of matching networks when driving a high Q series resonant coil since the step-down ratio of each individual matching network need not be as large, thereby allowing for the matching networks to have a higher bandwidth than would otherwise be possible.

In one example, the multiple strands 212 are physically constructed with multiple RF feeds (e.g. two, four, eight, etc.) located symmetrically around the perimeter of the resonant coil 200 to allow for equal current division and matching parasitic capacitance among each of the strands and also to allow for a well-balanced RF feed network. This in turn enables the plurality of matching networks to be symmetrically located or arranged around the resonant coil 200 as well, and also to have equal characteristics, thus allowing the multiple strands 212 to equally share current and minimize loss.

The resonant coil 200 includes four switch capacitor networks 202a, 202b, 202c, and 202d (hereinafter "switch capacitor network(s) 202"). Although four switch capacitor networks 202 are illustrated, another example resonant coil (not shown) may include any suitable number of switch capacitor networks. The switch capacitor networks 202 are positioned symmetrically around the resonant coil 200, which provides for equal phase signals between each of the switch capacitor networks 202 from a single RF port via the branching paths 206. Thus, a single electrical connection from a probe reader (e.g. corresponding to the probe reader 108 of FIG. 1). facilitates control of the resonant coil 200 without the need for additional wires.

Each of the switch capacitor networks 202 include a switch 204a, 204b, 204c, and 204d (hereinafter switch(es) 204). In one example, the switch 204 is a Super-Lattice Castellated Field Effect Transistor (SLCFET), such as shown in US patent publication no. 2016/0293713. An SLCFET switch is a low loss, high $R_{on}*C_{off}$ switch, and therefore enables the resonant coil 200 to be tuned while maintaining a high quality (Q) factor. It should be appreciated that other types of switches, such as a Gallium Arsenide (GaAs) switch, may be used. A DC voltage control signal from the probe reader is routed to the respective gates of the switches 204 to switch the switches 204 on and off.

The switch capacitor networks 202 each further include a first capacitor 208a, 208b, 208c, and 208d (hereinafter "first capacitor 208"), respectively, coupled to the switch 204 in parallel. The switch capacitor networks 202 each further include a second capacitor 210a 210b, 210c, and 210d (hereinafter "second capacitor 210"), respectively, coupled to the switch 204 in series. Thus, depending on whether the switch 204 is in an on or off state, either the first capacitor 208 or the second capacitor 210 is charged. Since the resonant frequency of the resonant coil 200 is affected based on which of the first and second capacitors 208 and 210 are being charged, the resonant frequency of the resonant coil 200 may be adjusted by turning the switch 204 on or off.

By incorporating four slightly differently configured switch capacitor networks 202 into the resonant coil 200, the resonant coil 200 may be tuned to a desired resonant frequency based on various combinations of activated switches 204. In particular, the four switch capacitor networks 202 each have three tuning states which can be selected by applying a positive, ground, or negative DC bias voltage to the single RF port in order to flip the appropriate switches 204. By configuring the switches 204 to respond differently to the positive, ground, or negative DC bias, the switch capacitor networks 202 may be engaged in various combinations in order to tune the resonant coil 200 to a desired resonant frequency.

For example, the first and second switches 204a and 204b may be configured to go to an ON state when a positive DC bias is applied, the third and fourth switches 204c and 204d may be configured to go to an ON state when a negative DC bias is applied, and all four switches 204a 204b, 204c, and 204d may be configured to go to an ON state when the DC bias is ground. Thus, the different states of the switch capacitor networks 202 allow for different combinations of capacitors to charge, thereby tuning the resonant frequency of the resonant coil 200 to a desired resonant frequency.

It should be appreciated that configurations described herein are not limiting and that the switches 204 may be configured to respond to the positive, ground, or negative DC bias in any suitable combination. It should be further appreciated that although the resonant coil 200 is illustrated as a differential form of a coil with four differential inputs, in another example embodiment (not shown), a resonant coil may include four single ended inputs with the far end of the of the coil's turns grounded.

Figure 3:
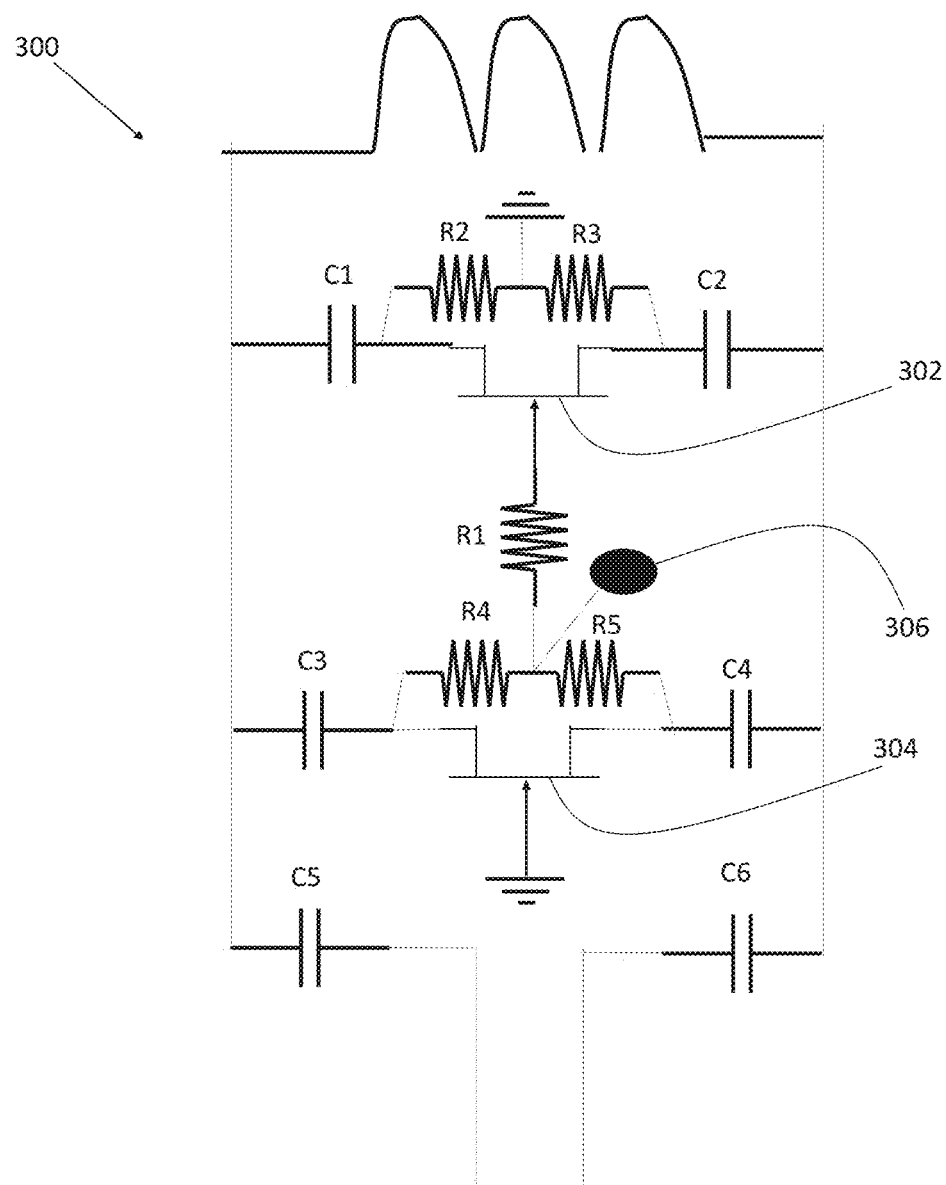
FIG. 3 illustrates an example switch capacitor network of the resonant coil of FIG. 2.

FIG. 3 illustrates one example configuration of a first switch 302 and a second switch 304 of a switch capacitor network 300 (e.g. corresponding to the switch capacitor network 202 of FIG. 2). In particular, the first switch 302 is coupled to a resistor R1 at a gate and coupled to resistors R2 and R3 at a drain and source such that the first switch 302 is ON when a positive DC bias 306 is applied. The second switch 304 is coupled to resistor R4 and R5 and a drain and source and coupled to ground at a gate such that the second switch 304 is ON when a negative DC bias 306 is applied. In addition, the first switch 302 and the second switch are both configured to be ON when the DC bias 306 is ground. It should be appreciated that although two-bit tuning control is described herein, another example embodiment (not shown) may include one-bit tuning.

In one example, resistors R1, R2, R3, R4, and R5 could be large (approximately 100 kOhm, for example) in order to avoid impacting Q. In one example, tuning capacitors C1, C2, C3, and C4 may be a small percentage of primary resonance capacitors C5 and C6. The switch capacitor network 300 may further include diodes (not shown) in order to avoid excessive forward bias of the first and second switches 302 and 304.

In one example, a Litz wire style coil winding may be used to increase metal cross section which current flows through in order to improve Q. Moreover, although the example illustrated herein depict a 4-turn coil, an 8-turn coil may also be used in order to further improve Q.

Figure 4:
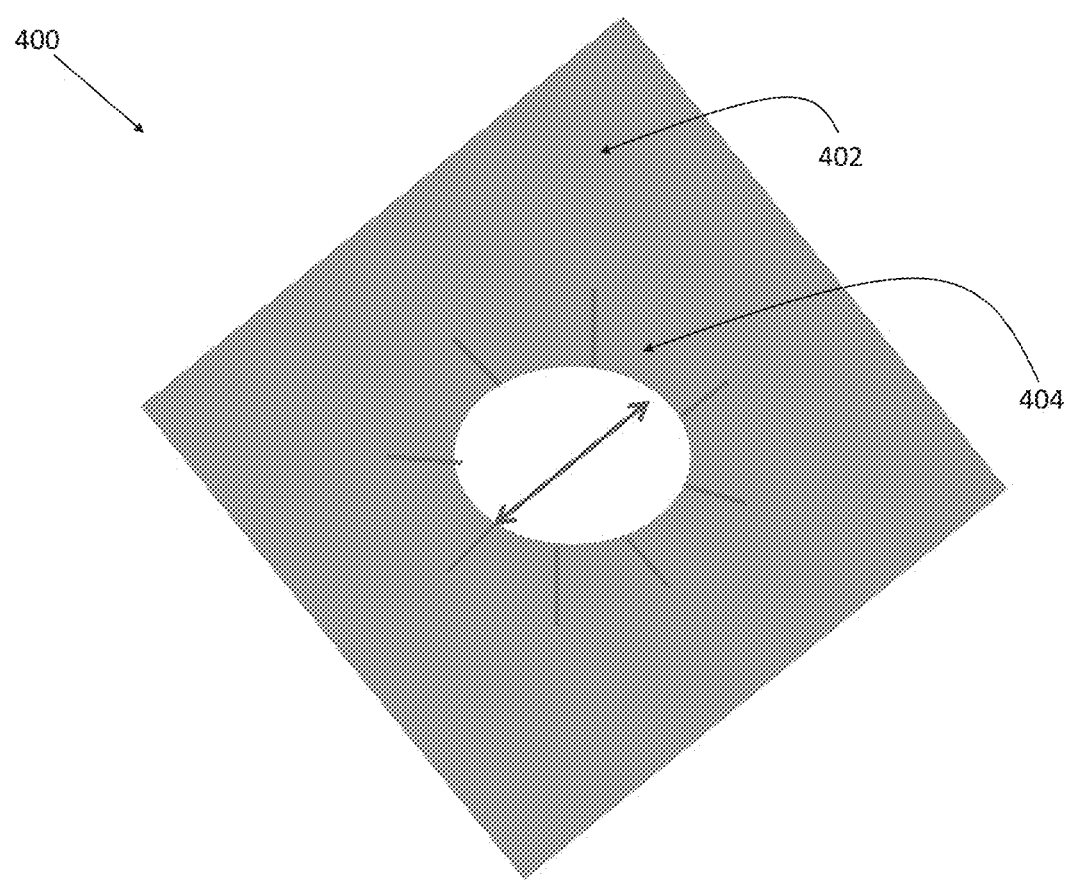
FIG. 4 illustrates a back side of an example substrate on which a resonant coil of FIG. 2 can be laid out.

In one example, a resonant coil (e.g. corresponding to the resonant coil 104 of FIG. 1 or the resonant coil 200 of FIG. 2) is laid out on a substrate such as a GaN substrate. In one example, the substrate also includes a slotted ground plane on an exposed surface in order to reduce eddy currents while allowing a magnetic field. FIG. 4 illustrates a back side 402 of an example substrate 400 including a slotted ground plane 404. The resonant coil is disposed on an inside surface (not shown) or front of the substrate 400 for added protection. The substrate 400 is configured to be disposed on probe tip (e.g. corresponding to the probe tip 102 of FIG. 1) such that the coil side or the inside surface faces inward and the back side 402 is exposed and faces outward.

Figure 5:
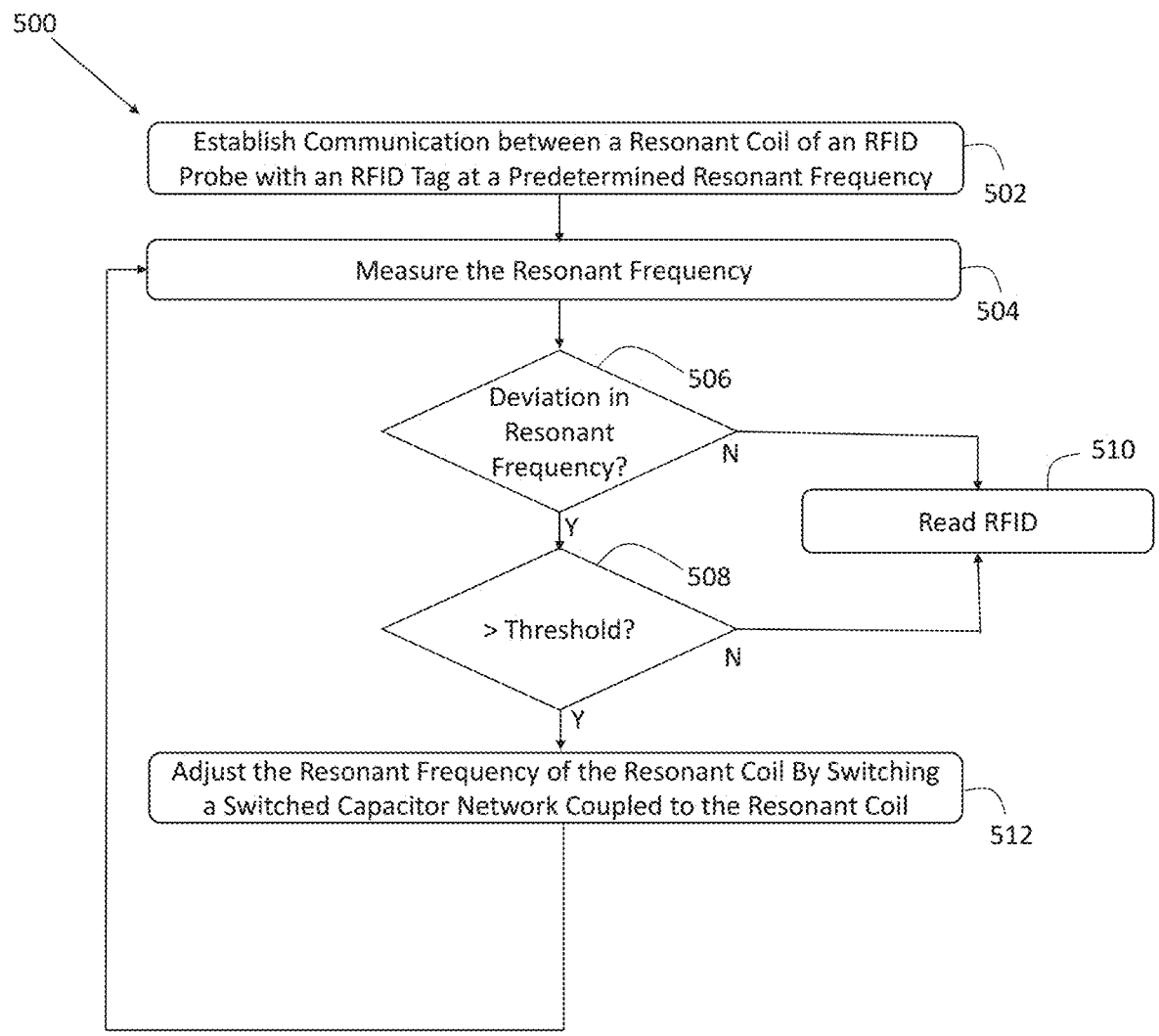
FIG. 5 illustrates a method for tuning an RFID probe.

An RFID probe (e.g. corresponding to the probe 100 of FIG. 1) will be further appreciated with reference to a method for tuning the probe illustrated in FIG. 5. At block 502, communication is established between a resonant coil of an RFID probe and an RFID tag at a predetermined resonant frequency by bringing the RFID probe into proximity of the RFID tag. At block 504, The resonant frequency of the resonant coil is measured. The deviation may be determined, for example, by a sensor either embedded in the RFID probe or external to the RFID probe. At block 506, a determination is made whether the resonant frequency of the resonant coil has deviated away from a target or desired resonant frequency.

If, at block 506, a determination is made that the resonant frequency of the resonant coil has not deviated from the desired resonant frequency, the RFID TAG is read by the RFID probe tip at block 510. If, at block 506, a determination is made that the resonant frequency of the resonant coil has deviated from the desired resonant frequency, a determination is then made, at block 508, whether the deviation is greater than a predefined threshold amount. In one example, the threshold amount may be determined based on a percentage of the desired resonant frequency. For example, a threshold amount may equal a 1% change in value of the resonant frequency.

If, at block 508, a determination is made that the deviation is not greater than the predefined threshold amount, than the RFID TAG is read by the RFID probe tip at block 510. If, at block 508, a determination is made that the deviation is greater than the predefined threshold amount, then, at block 512, the resonant frequency of the resonant coil is adjusted based on the determined deviation. The adjustment may be made, for example, by a control module appropriately switching switch capacitor networks coupled to the resonant coil. Once the adjustment is made, the resonant frequency of the resonant coil may be again measured at block 504. In one example, rather than again measuring the resonant coil at block 504, the RFID TAG is read by the RFID probe tip at block 510 after the adjustment is made at block 512.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. Additionally, where the disclosure or claims recite "a," "an," "a first," or "another" element, or the equivalent thereof, it should be interpreted to include one or more than one such element, neither requiring nor excluding two or more such elements.

What is claimed is:

1. A radio-frequency identification ("RFID") probe comprising:
a probe tip comprising a resonant coil configured to communicate with an RFID compatible device at a predetermined resonant frequency;
a plurality of switch capacitor networks each comprising a capacitor and an RF switch, wherein switching the plurality of switch capacitor networks changes the capacitance of the resonant coil, thereby changing a resonant frequency of the resonant coil;
a probe control module configured to adjust the resonant frequency of the resonant coil to maintain the predetermined resonant frequency by switching the switch capacitor networks responsive to detecting that the resonant frequency of the resonant coil has deviated from the predetermined resonant frequency; and
a substrate disposed in the probe tip, the substrate comprising a slotted ground plane on an exposed surface to reduce eddy currents from canceling out projected magnetic fields.

2. The RFID probe of claim 1, further comprising a sensor configured to determine the resonant frequency of the resonant coil, wherein the probe control module is communicatively coupled to the sensor and configured to detect the deviation in the resonant frequency by analyzing sensor data received from the sensor.

3. The RFID probe of claim 1, wherein the probe control module is configured to switch the plurality of switch capacitor networks by sending a DC voltage signal to the plurality of switch capacitor networks.

4. The RFID probe of claim 3, wherein the probe control module is configured to send one of a positive DC bias voltage signal, a negative DC bias voltage signal, and a ground DC bias voltage signal, wherein DC voltage is received on a same connection as an RF signal, and wherein each of the RF switches of the plurality of switch capacitor networks are configured to respond to the DC voltage signal to provide different comparative values to adjust the resonant frequency of the resonant coil.

5. The RFID probe of claim 1, wherein the RF switches comprise a Super-Lattice Castellated Field Effect Transistor (SLCFET).

6. The RFID probe of claim 1, wherein the resonant coil and the plurality of switch capacitor networks are located in an inside surface of the substrate.

7. The RFID probe of claim 1, wherein the resonant coil comprises a plurality of strands in a crisscross spiral form that are connected in parallel.

8. The RFID probe of claim 7, wherein the plurality of strands are fed with one of differential RF excitation and single ended RF excitation, and wherein the far end of each of the plurality of strands are grounded.

9. The RFID probe of claim 7, wherein the plurality of strands are driven from a common RF signal brought to the probe tip through a single connection with at least one of RF splitters, baluns, and on chip matching networks with the resonant coil.

10. The RFID probe of claim 7, wherein the plurality of strands are driven from a common RF signal and a plurality of step-down matching impedance networks, wherein the impedance of the plurality of strands matches a low impedance characteristic of a high Q series resonant network, and wherein the impedances of each of the strands of the plurality of strands are aggregated in parallel.

11. The RFID probe of claim 7, wherein the plurality of strands are constructed with a plurality of RF feeds located symmetrically around a perimeter of the resonant coil.

12. A tunable resonant coil comprising:
a plurality of strands in a crisscross spiral form that are connected in parallel; and
a plurality of switch capacitor networks, each comprising a capacitor and an RF switch, wherein the plurality of switch capacitor networks are configured to change a capacitance of the resonant coil, thereby change a resonant frequency of the resonant coil, responsive to receiving a control signal indicating that the resonant frequency of the resonant coil has deviated from a predetermined resonant frequency,
wherein the plurality of switch capacitor networks are configured to change the capacitance of the resonant coil by receiving a DC voltage signal comprising one of a positive DC bias voltage signal, a negative DC bias voltge signal, and a ground DC bias voltage signal.

13. The tunable resonant coil of claim 12, further comprising:
a sensor configured to determine the resonant frequency of the resonant coil; and
a control module coupled to the sensor configured to communicate the control signal;
wherein the control module is configured to communicate the control signal responsive to detecting the deviation in the resonant frequency by analyzing sensor data received from the sensor.

14. The tunable resonant coil of claim 12, wherein each of the RF switches of the plurality of switch capacitor networks are configured to respond to the DC voltage signal to provide different comparative values to adjust the resonant frequency of the resonant coil.

15. The tunable resonant coil of claim 12, wherein the RF switches comprise a Super-Lattice Castellated Field Effect Transistor (SLCFET).

16. The tunable resonant coil of claim 12, wherein the tunable resonant coil is disposed on an inside surface of a substrate, and wherein the substrate comprises a slotted ground plane on an exposed surface.

17. The tunable resonant coil of claim 12, wherein the tunable resonant coil is disposed in a radio-frequency identification ("RFID") probe.

18. The tunable resonant coil of claim 12, wherein the tunable resonant coil is configured to receive the control signal from a control module responsive to the control module detecting the deviation in the resonant frequency by analyzing sensor data received from a sensor.

19. A tunable resonant coil comprising:
a plurality of switch capacitor networks, each comprising a capacitor and an RF switch, wherein the plurality of switch capacitor networks are configured to change a capacitance of the resonant coil, thereby change a resonant frequency of the resonant coil, responsive to receiving a control signal indicating that the resonant frequency of the resonant coil has deviated from a predetermined resonant frequency, wherein the tunable resonant coil is disposed in a radio-frequency identification ("RFID") probe, wherein the plurality of switch capacitor networks are configured to change the capacitance of the resonant coil by receiving a DC voltage signal comprising one of a positive DC bias voltage signal, a negative DC bias voltage signal, and a ground DC bias voltage signal.

* * * * *